United States Patent [19]

Yoshida

[11] Patent Number: 4,984,051
[45] Date of Patent: Jan. 8, 1991

[54] SEMICONDUCTOR DEVICE HAVING DIRECTLY CONNECTED SOURCE TERMINAL

[75] Inventor: Shigekazu Yoshida, Itami, Japan

[73] Assignee: Mitsubishi Denki Kabushiki Kaisha, Tokyo, Japan

[21] Appl. No.: 183,053

[22] Filed: Apr. 19, 1988

[30] Foreign Application Priority Data

May 8, 1987 [JP] Japan ................................ 62-112917

[51] Int. Cl.⁵ ............................................. H01L 27/02
[52] U.S. Cl. .......................................... 357/42; 357/65
[58] Field of Search ........................ 357/42, 65, 68, 71

[56] References Cited

U.S. PATENT DOCUMENTS 4,574,299  3/1986  Glascock ............................... 357/68
4,866,502  9/1989  Tomaszewski et al. ............... 357/68

Primary Examiner—William L. Sikes
Assistant Examiner—Robert E. Wise
Attorney, Agent, or Firm—Oblon, Spivak, McClelland, Maier & Neustadt

[57] ABSTRACT

The present invention relates to an improvement in an electrode structure of a semiconductor device having a MOSFET chip, wherein a source terminal is directly connected to a source electrode of the semiconductor device so that the source terminal overlaps with the source electrode. By employing the electrode structure, a semiconductor device having a high switching speed, low power loss and high mass productivity is obtained.

5 Claims, 3 Drawing Sheets

SEMICONDUCTOR DEVICE HAVING DIRECTLY CONNECTED SOURCE TERMINAL

BACKGROUND OF THE INVENTION

1. Field of the Invention

The present invention relates to a semiconductor device comprising a MOSFET chip having one surface on which a gate electrode and a source electrode are provided and other surface on which a drain electrode is provided, and more particularly, it relates to an improvement in the structure of the source electrode.

2. Description of the Prior Art

An ordinary power MOSFET chip has a lot of MOSFET elements being electrically interconnected in parallel.

FIG. 1 is a plane view of such a power MOSFET chip, and FIG. 2 is a cross section showing a schematical structure of the power MOSFET chip. The structure shown in FIG. 1 and FIG. 2 is common to power MOSFET chips 1a and 1b, since structures of the power MOSFET chips 1a and 1b are identical to each other. In order to distinguish the power MOSFET chip 1a from the power MOSFET chip 1b, components with respect to the chips 1a and 1b are referred by reference numerals having suffix "a" and "b", respectively.

Referring to FIGS. 1 and 2, an N$^-$-type layer 13a (13b) is epitaxially grown on one major surface of an N$^+$-type semiconductor substrate 12a (12b). Impurities are selectively diffused from the surface of the N$^-$-type layer 13a (13b) to form a plurality of P$^+$-type regions 14a (14b), while impurities are selectively diffused from the surface of each P$^+$-type region 14a (14b) to form a pair of N$^+$-type regions 15a (15b). As shown in FIG. 2, an insulation layer 16a (16b) is formed on the surfaces of the P$^+$-type regions 14a (14b) between the surface of the N$^-$-type layer 13a (13b) and those of the N$^+$-type regions 15a (15b). The insulation layer 16a (16b) also covers the surface of the portion of the N$^+$-type regions 15a (15b) and the surface of the N$^-$-type layer 13a (13b) between the P$^+$-type regions 14a (14b). A gate electrode 17a (17b) of, e.g., polysilicon is formed into the insulation layer 16a (16b), while a source electrode 19a (19b) of metal such as aluminum is formed to be electrically connected to both of the P$^+$-type regions 14a (14b) and N$^+$-type regions 15a (15b). On the rear surface of the N$^+$-type semiconductor substrate 12a (12b), a metal drain electrode 18a (18b) is provided. The gate electrodes 17a (17b) are connected to a gate terminal 3a (3b) and the source electrode 19a (19b) is connected to a source terminal 2a (2b), while the drain electrode 18a (18b) is connected to a drain terminal 4a (4b) respectively.

FIG. 3 is a plane view showing the structure of a conventional semiconductor device having the power MOSFET chips 1a and 1b in a state that wire bonding processes are completed, and FIG. 4 is a cross section of the semiconductor device after an assembly process. As shown in FIG. 3, insulation layers 9a and 9b are formed on a substrate 5 of the semiconductor device to align with a constant interval. A source terminal 2a, a gate terminal 3a and a drain terminal 4a are provided on the insulation layer 9a, while a source terminal 2b, a gate terminal 3b and a drain terminal 4b are provided on the insulation layer 9b. Two power MOSFET chips 1a and two power MOSFET chips 1b are mounted on the drain terminals 4a and 4b, respectively. The power MOSFET chips 1a and 1b are fixed on the drain terminals 4a and 4b by connection layers 10a and 10b, respectively, thereby to establish electrical and mechanical connections therebetween. The connection layers 10a and 10b may be layers of solder, brazing filler metal or the like. The gate electrodes 17a of the power MOSFET chips 1a shown in FIG. 1 and FIG. 2 are electrically connected to the gate terminal 3a by gate wires 7a. On the other hand, the source electrodes 19a of the power MOSFET chips 1a shown in FIG. 1 and FIG. 2 are electrically connected to the source terminals 2 by bounding wires 8a. Although the location of 17a (17b) and 19a (19b) are not shown in FIG. 3, they form part of the top layer of chip 1a (1b) including the points to which wires 8a (8b) are connected. A connecting structure for the power MOSFET chip 1b is similar to that for the power MOSFET chip 1a. Namely, the gate electrodes 17b and the source electrodes 19b are connected to the gate terminal 3b and the source terminal 2b by bonding wires 7b and 8b, respectively.

FIG. 5 is an equivalent circuit diagram of the MOSFET element. A diode 21 shown in FIG. 5 is constructed by a PN junction structure consisting of the N$^-$-type layer 13a (13b) and the P$^+$-type region 14a (14b), each of which is shown in FIG. 2. An N-channel MOSFET 24 is constructed by an NPN junction structure consisting of the N$^+$-type region 15a (15b), the P$^+$-type region 14a (14b) and the N$^-$-type layer 13a (13b), each of which is shown in FIG. 2.

FIG. 6 shows an equivalent circuit of the semiconductor device of FIG. 3. A circuit 22 corresponds to an equivalent circuit of the power MOSFET chips 1a shown in FIG. 3. Since each power MOSFET chip 1a is constructed by interconnecting the MOSFET elements of FIG. 5 in parallel, the circuit 22 expressing the equivalent circuit of the power MOSFET chips 1a is identical to that of the MOSFET elements shown FIG. 5. Similarily, a circuit 23 expresses an equivalent circuit of the power MOSFET chips 1b shown in FIG. 3.

After the wire bonding processes, a case 6 of epoxy resin or the like is fixed to the substrate 5, thereby to complete the assembly of the semiconductor device.

In the semiconductor device constructed as above, the following operation characters are required: First is a high speed switching character, the second is a high voltage-proof and a large current capacity, and the third is a low power loss in a switching operation.

Usually, a current of several ten to one hundred amperes flows in a semiconductor device, and an electrode structure capable of such a current is required. In a prior art, the requirement is satisfied by increasing the source wires 8a and 8b in number so that a current density in each source wire is decreased. For example, the device shown in FIG. 3 has three source wires for each power MOSFET chip.

Recently, however, the number of wires is increased according to an increase of a control current, thereby to cause the following problems:

(1) Since the intrinsic inductance of the source wire cannot be ignored, the switching speed decreases.

(2) A contact resistance in bonding structure is increased, and therefore, a power loss caused in the bonding structure is increased.

(3) A mass productivity of the semiconductor device is deteriorated, since the bonding process becomes to be complicated.

Further, since a size of the semiconductor device comprising the MOSFET chip is larger than that of other semiconductor devices such as a dynamic random access memory, the bonding wires used in the former should be longer than those used in the latter. As a result, the electric resistance of the source wires employed in the semiconductor device comprising the MOSFET chip increases, and therefore, a power loss in the source wires also increases.

SUMMARY OF THE INVENTION

According to the present invention, a semiconductor device comprises a MOSFET chip having one surface on which a gate electrode and a source electrode are provided and other surface on which a drain electrode is provided, and a source terminal connected to the source electrode so that the source terminal overlaps with a surface of the source electrode.

Accordingly, an object of the present invention is to provide a semiconductor device having a high switching speed, low power loss in operation and high mass productivity.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
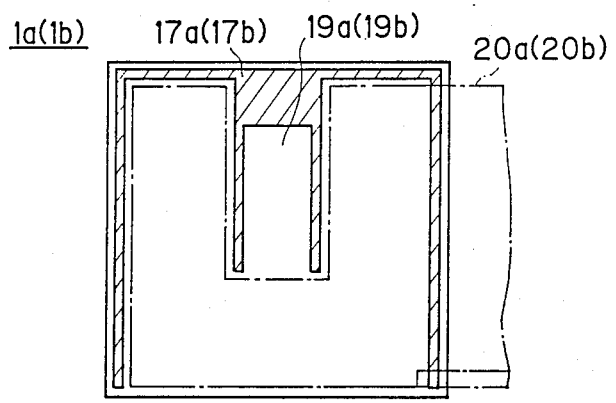
FIG. 1 is a plan view of a power MOSFET chip.
Figure 3:
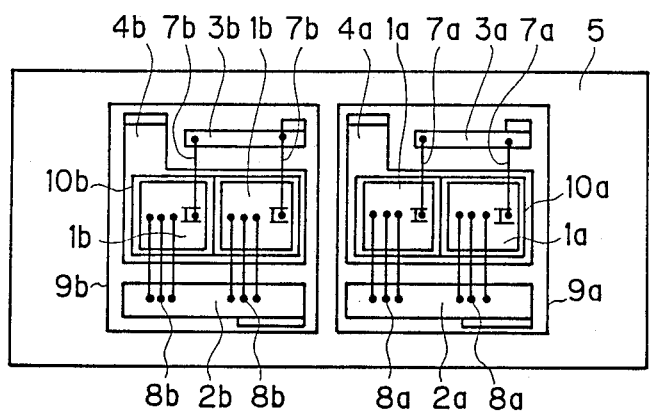
FIG. 3 is a plane view of a structure of a conventional semiconductor device comprising the power MOSFET chip showing a state after wire bonding processes.
Figure 4:
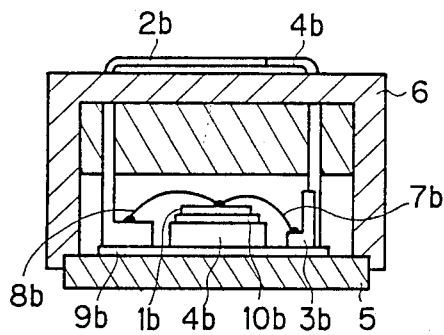
FIG. 4 is a cross section of the conventional semiconductor device after assembly.
Figure 5:
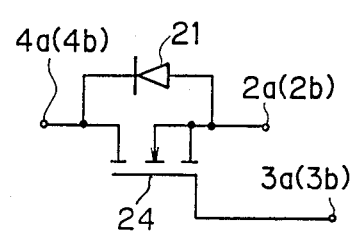
FIG. 5 shows an equivalent circuit of a MOSFET element.
Figure 6:
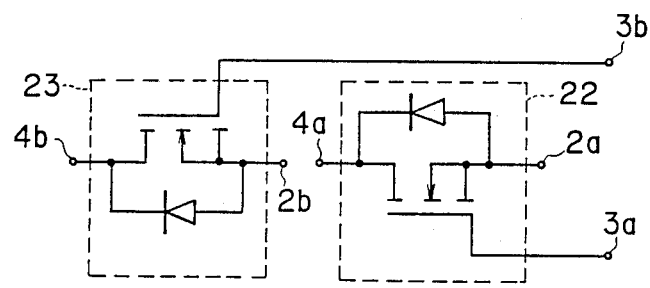
FIG. 6 shows an equivalent circuit of the semiconductor device shown in FIG. 3.
Figure 7:
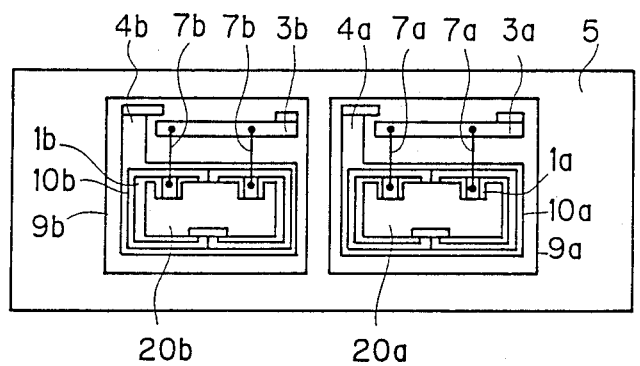
FIG. 7 is a plane view showing a semiconductor device having a MOSFET chip and constructed according to a preferred embodiment of the present invention.
Figure 8:
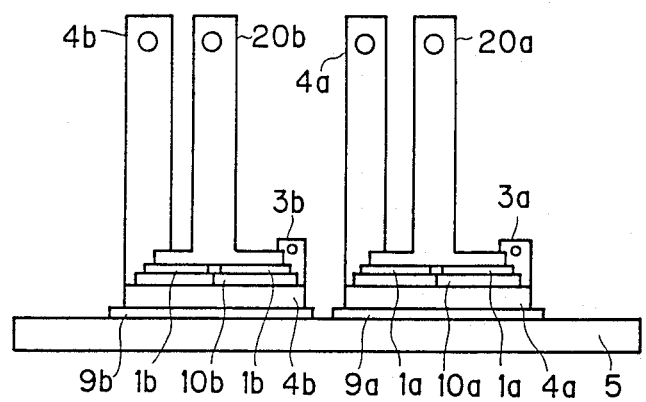
FIG. 8 is an elevation view of the semiconductor device of FIG. 7.
Figure 9:
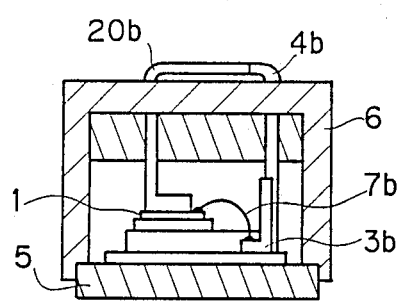
FIG. 9 is a cross section of the semiconductor device of FIG. 7 after completion of assembly.

FIG. 7 and FIG. 8 are a plane view and an elevation view of a semiconductor device according to a preferred embodiment of the present invention, respectively. A cross section of the semiconductor device after completion of assembly is shown in FIG. 9. In the conventional device described above and especially as shown in FIGS. 3 and 4, the source electrode is connected to a source terminal 2a through a source wire 8a. The present invention improves on this situation, as shown in FIGS. 7 to 9 by having the source terminal 20a being provided directly on the source electrode 19a contained within chip 1a. Thus, the source electrode and the source terminal are directly interconnected. As shown in FIG. 1, the source terminal 20a substantially covers the source electrode 19a. The other construction of the embodiment is identical to that of the conventional device shown in FIG. 3 and FIG. 4, and a description of the construction is omitted. Although FIGS. 7 and 8 do not show the source electrode 19a (19b), it is clear from the description of FIG. 1 that it forms part of the top layer of 1a (1b) but lies beneath the source terminal 20a (20b) and is hidden thereby.

Figure 2:
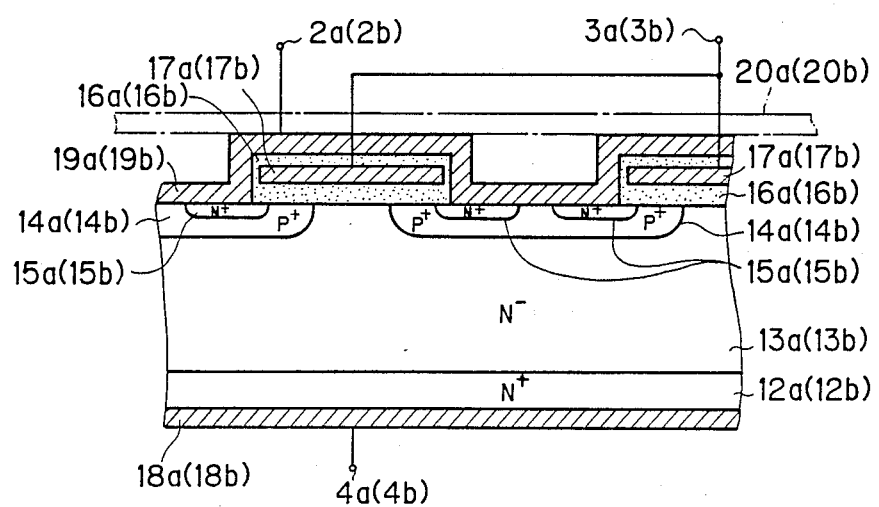
FIG. 2 is a cross section of the power MOSFET chip showing the schematic structure thereof.

In the present invention, the source terminal 20a is placed on the source electrodes 19a of the two power MOSFET chips 1a mounted on a drain terminal 4a, and the source terminal 20b is placed on the source electrodes 19b of the two power MOSFET chips 1b mounted on drain terminal 4b. The positional relationship between the source terminal 20a (20b) and the source electrodes 19a (19b) is indicated in phantom in FIG. 1 and FIG. 2, to show that the source terminal 20a (20b) would be on provided on the source electrodes 19a (19b) of the MOSFET chips 1a (1b), thereby the respective source electrodes 19a (19b) of the two MOSFET chips 1a (1b) are electrically connected to the source terminal 20a (20b). The source terminal 20a (20b) and the source electrodes 19a (19b) may be interconnected by soldering, brazing or the like, or may be interconnected each other by a pressure welding.

In a case that the soldering, the brazing or the like is employed to interconnect therebetween, as shown in FIG. 7 and FIG. 8, the source electrodes 19a (19b) and the source terminal 20a (20b) are substantially and electrically interconnected similarily to the interconnection between the power MOSFET chip 1a (1b) and the drain terminal 4a (4b). Then, the source terminals 20a and 20b and the drain terminals 4a and 4b are inserted into through holes (not shown) provided at predetermined positions of a case 6, respectively, and the case 6 is fixed on a substrate 5. Finally, as shown in FIG. 9, portions of the terminals 20a, 20b, 4a and 4b projecting out of the case 6 are bent, and an assembly process is completed.

On the other hand, when the pressure connection is employed to interconnection between the source terminal 20a (20b) and the source electrodes 19a (19b), the source terminal 20a (20b) is tight installed in the case of FIG. 9, prior to an interconnection process between the source terminal 20a (20b) and the source electrodes 19a (19b). The case 6 is then fixed on the substrate 5 so that the source terminal 20a (20b) and the source electrode 19a (19b) are in positional relationship shown in FIG. 1 and FIG. 2. As a result, the case 6 pushes the source terminal 20a (20b) on the source electrodes 19a (19b), thereby the source terminal 20a (20b) and the source electrodes 19a (19b) are electrically interconnected.

Although one source terminal 20a (20b) is provided for each two power MOSFET chips 1a (1b) in the embodiment, one source terminal 20a (20b) may be provided for each power MOSFET chip or for every three or more power MOSFET chips. Furthermore, the present invention may be also applied to a semiconductor device other than the semiconductor device having the power MOSFET chip, as long as it comprises a MOSFET chip having one surface on which a gate region and a source region are provided and other surface on which a drain region is provided.

As hereinabove described, since the source electrode 19a (19b) of the power MOSFET chip 1a (1b) and the source terminal 20a (20b) are interconnected electrically, the following advantages are obtained:

(1) Since the inductance of the source connection structure is decreased to be ignored, high switching operation is achieved.

(2) The contact area on which the source electrode 19a (19b) and the source terminal 20a (20b) are connected to each other is larger than that of the conventional device, and therefore, the contact resistance at the contact area is decreased and the power loss is prevented.

(3) Since no source wires 8a and 8b are required, the wire bonding processes is simplified to improve the mass productivity of the semiconductor device.

Namely, according to the present invention, a semiconductor device having a high switching speed, low power loss in operation and excellent mass productivity can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a MOSFET chip having one surface on which a gate electrode and a source electrode are provided and another surface on which a drain electrode is provided; and
    a source terminal connected to said source electrode of said MOSFET chip and being placed on said source electrode so as to substantially cover said source electrode.

2. A semiconductor device in accordance with claim 1, wherein
    a solder layer is provided between said source electrode and said source terminal, so that said source electrode and said source terminal are interconnected by said soldar layer.

3. A semiconductor device in accordance with claim 1, wherein
    a brazing filler metal layer is provided between said source electrode and said source terminal, so that said source electrode and said source terminal are interconnected by said brazing filler metal layer.

4. A semiconductor device in accordance with claim 1, wherein
    said MOSFET chip is mounted on a substrate,
    a case in which said source electrode is tight installed is fixed on said substrate so as to receive said MOSFET chip in said case, and
    said case pushes said source terminal on said source electrode so that said source terminal and said source electrode are interconnected.

5. A semiconductor device in accordance with claim 1, wherein
    said semiconductor device has a plurality of MOSFET chips each of which is served as said MOSFET chip, and
    said source terminal is placed on and connected to respective source electrodes of said MOSFET chips so as to substantially cover each of said source electrodes.

* * * * *